ized States Patent (12) United States Patent
Lafort et al.

(10) Patent No.: US 10,264,361 B2
(45) Date of Patent: Apr. 16, 2019

(54) TRANSDUCER WITH A HIGH SENSITIVITY (71) Applicant: Sonion Nederland B.V., Hoofddorp (NL)

(72) Inventors: Adrianus Maria Lafort, Hoofddorp (NL); Aart Zeger van Halteren, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 0 days.

(21) Appl. No.: 15/816,123

(22) Filed: Nov. 17, 2017

(65) Prior Publication Data

US 2018/0146295 A1 May 24, 2018

(30) Foreign Application Priority Data

Nov. 18, 2016 (EP) ..................................... 16199651

(51) Int. Cl.
*H03F 1/02* (2006.01)
*H04R 9/08* (2006.01)
*H03F 3/183* (2006.01)
*H04R 19/00* (2006.01)
*H04R 19/01* (2006.01)
*H04R 19/04* (2006.01)

(52) U.S. Cl.
CPC ............. *H04R 9/08* (2013.01); *H03F 1/0227* (2013.01); *H03F 3/183* (2013.01); *H04R 19/016* (2013.01); *H04R 19/04* (2013.01); *H03F 2200/03* (2013.01); *H04R 19/005* (2013.01); *H04R 2201/003* (2013.01)

(58) Field of Classification Search
CPC ...... H01L 2924/1461; H04R 2201/003; H04R 31/00; H04R 3/00; H04R 31/006
See application file for complete search history.

(56) References Cited

U.S. PATENT DOCUMENTS

| 6,788,796 | B1 | 9/2004 | Miles |
| 6,831,577 | B1 | 12/2004 | Furst |
| 6,853,290 | B2 | 2/2005 | Jorgensen |
| 6,859,542 | B2 | 2/2005 | Johannsen |
| 6,888,408 | B2 | 5/2005 | Furst |

(Continued)

FOREIGN PATENT DOCUMENTS

| EP | 1553696 A1 | 7/2005 | |
| EP | 1906704 A1 * | 4/2008 | ........... H04R 19/005 |

(Continued)

OTHER PUBLICATIONS

Extended European Search Report in European Patent Application No. EP 16199651, dated Mar. 31, 2017 (3 pages).

(Continued)

*Primary Examiner* — Mohammad K Islam
(74) *Attorney, Agent, or Firm* — Nixon Peabody LLP (57) ABSTRACT An assembly including a transducer, such as a capacitive transducer, a vibration sensor or a microphone, and an amplifier for receiving and amplifying an output of the transducer, where the amplifier is supplied with a voltage being at least 60% of a voltage corresponding to an electrical field between two elements of the transducer. When the transducer is a biased transducer, the amplifier is supplied with a voltage being at least 60% of a biasing voltage of the transducer.

17 Claims, 4 Drawing Sheets

(56) References Cited

U.S. PATENT DOCUMENTS

| | | |
|---|---|---|
| 6,914,992 B1 | 7/2005 | van Halteren |
| 6,919,519 B2 | 7/2005 | Ravnkilde |
| 6,930,259 B1 | 8/2005 | Jorgensen |
| 6,943,308 B2 | 9/2005 | Ravnkilde |
| 6,974,921 B2 | 12/2005 | Jorgensen |
| 7,008,271 B2 | 3/2006 | Jorgensen |
| 7,012,200 B2 | 3/2006 | Moller |
| 7,062,058 B2 | 6/2006 | Steeman |
| 7,062,063 B2 | 6/2006 | Hansen |
| 7,072,482 B2 | 7/2006 | Van Doorn |
| 7,088,839 B2 | 8/2006 | Geschiere |
| 7,110,560 B2 | 9/2006 | Stenberg |
| 7,136,496 B2 | 11/2006 | van Halteren |
| 7,142,682 B2 | 11/2006 | Mullenborn |
| 7,149,317 B2 | 12/2006 | Lafort |
| 7,181,035 B2 | 2/2007 | van Halteren |
| 7,190,803 B2 | 3/2007 | van Halteren |
| 7,206,428 B2 | 4/2007 | Geschiere |
| 7,221,766 B2 | 5/2007 | Boor |
| 7,221,767 B2 | 5/2007 | Mullenborn |
| 7,221,769 B1 | 5/2007 | Jorgensen |
| 7,227,968 B2 | 6/2007 | van Halteren |
| 7,239,714 B2 | 7/2007 | de Blok |
| 7,245,734 B2 | 7/2007 | Niederdraenk |
| 7,254,248 B2 | 8/2007 | Johannsen |
| 7,286,680 B2 | 10/2007 | Steeman |
| 7,292,700 B1 | 11/2007 | Engbert |
| 7,292,876 B2 | 11/2007 | Bosh |
| 7,336,794 B2 | 2/2008 | Furst |
| 7,376,240 B2 | 5/2008 | Hansen |
| 7,403,630 B2 | 7/2008 | Jorgensen |
| 7,415,121 B2 | 8/2008 | Mögelin |
| 7,425,196 B2 | 9/2008 | Jorgensen |
| 7,460,681 B2 | 12/2008 | Geschiere |
| 7,466,835 B2 | 12/2008 | Stenberg |
| 7,492,919 B2 | 2/2009 | Engbert |
| 7,548,626 B2 | 6/2009 | Stenberg |
| 7,657,048 B2 | 2/2010 | van Halteren |
| 7,684,575 B2 | 3/2010 | van Halteren |
| 7,706,561 B2 | 4/2010 | Wilmink |
| 7,715,583 B2 | 5/2010 | Van Halteren |
| 7,728,237 B2 | 6/2010 | Pedersen |
| 7,809,151 B2 | 10/2010 | Van Halteren |
| 7,822,218 B2 | 10/2010 | Van Halteren |
| 7,899,203 B2 | 3/2011 | Van Halteren |
| 7,912,240 B2 | 3/2011 | Madaffari |
| 7,946,890 B1 | 5/2011 | Bondo |
| 7,953,241 B2 | 5/2011 | Jorgensen |
| 7,961,899 B2 | 6/2011 | Van Halteren |
| 7,970,161 B2 | 6/2011 | van Halteren |
| 8,098,854 B2 | 1/2012 | van Halteren |
| 8,101,876 B2 | 1/2012 | Andreasen |
| 8,103,039 B2 | 1/2012 | van Halteren |
| 8,160,290 B2 | 4/2012 | Jorgensen |
| 8,170,237 B2 | 5/2012 | Shajaan |
| 8,170,249 B2 | 5/2012 | Halteren |
| 8,189,804 B2 | 5/2012 | Hruza |
| 8,189,820 B2 | 5/2012 | Wang |
| 8,223,981 B2 | 7/2012 | Haila |
| 8,223,996 B2 | 7/2012 | Beekman |
| 8,233,652 B2 | 7/2012 | Jorgensen |
| 8,259,963 B2 | 9/2012 | Stenberg |
| 8,259,976 B2 | 9/2012 | van Halteren |
| 8,259,977 B2 | 9/2012 | Jorgensen |
| 8,280,082 B2 | 10/2012 | van Halteren |
| 8,284,966 B2 | 10/2012 | Wilk |
| 8,313,336 B2 | 11/2012 | Bondo |
| 8,315,422 B2 | 11/2012 | van Halteren |
| 8,331,595 B2 | 12/2012 | van Halteren |
| 8,369,552 B2 | 2/2013 | Engbert |
| 8,379,899 B2 | 2/2013 | van Halteren |
| 8,509,468 B2 | 8/2013 | van Halteren |
| 8,526,651 B2 | 9/2013 | Lafort |
| 8,526,652 B2 | 9/2013 | Ambrose |
| 8,625,809 B2 | 1/2014 | Josefsson |
| 8,630,429 B2 | 1/2014 | Daley |
| 8,873,773 B2 | 10/2014 | Akino |
| 9,148,729 B2 | 9/2015 | Josefsson |
| 9,197,967 B2 | 11/2015 | Mortensen |
| 9,300,259 B2 | 3/2016 | Frohlich |
| 9,716,945 B2 | 7/2017 | Lesso |
| 9,781,518 B2 * | 10/2017 | Schober ............... H04R 17/02 |
| 2002/0125949 A1 | 9/2002 | Stenberg |
| 2004/0179703 A1 | 9/2004 | Boor |
| 2007/0160234 A1 | 7/2007 | Deruginsky |
| 2008/0025531 A1 | 1/2008 | Suzuki |
| 2008/0205668 A1 | 8/2008 | Torii |
| 2009/0003629 A1 | 1/2009 | Shajaan |
| 2010/0166228 A1 | 7/2010 | Steele |
| 2010/0246859 A1 | 9/2010 | Filippo |
| 2010/0329487 A1 | 12/2010 | David |
| 2011/0182453 A1 | 7/2011 | van Hal |
| 2011/0189880 A1 | 8/2011 | Bondo |
| 2011/0299708 A1 | 12/2011 | Bondo |
| 2011/0299712 A1 | 12/2011 | Bondo |
| 2011/0311069 A1 | 12/2011 | Ambrose |
| 2012/0014548 A1 | 1/2012 | van Halteren |
| 2012/0027245 A1 | 2/2012 | van Halteren |
| 2012/0140966 A1 | 6/2012 | Mocking |
| 2012/0155683 A1 | 6/2012 | van Halteren |
| 2012/0155694 A1 | 6/2012 | Reeuwijk |
| 2012/0255805 A1 | 10/2012 | van Halteren |
| 2012/0269367 A1 | 10/2012 | Akino |
| 2013/0028451 A1 | 1/2013 | de Roo |
| 2013/0051582 A1 | 2/2013 | Kropfitsch |
| 2013/0129117 A1 | 5/2013 | Thomsen |
| 2013/0136284 A1 | 5/2013 | van Hal |
| 2013/0142370 A1 | 6/2013 | Engbert |
| 2013/0163799 A1 | 6/2013 | Van Halteren |
| 2013/0195291 A1 | 8/2013 | Josefsson |
| 2013/0195295 A1 | 8/2013 | van Halteren |
| 2014/0003609 A1 | 1/2014 | Rombach |
| 2014/0037121 A1 | 2/2014 | Mortensen |
| 2014/0086433 A1 | 3/2014 | Josefsson |
| 2014/0264652 A1 | 9/2014 | Cagdaser |
| 2015/0023529 A1 | 1/2015 | Barzan |
| 2015/0137834 A1 | 5/2015 | Steiner |
| 2015/0181352 A1 | 6/2015 | Astgimath |
| 2015/0245143 A1 | 8/2015 | Akino |
| 2016/0337753 A1 | 11/2016 | Akino |
| 2016/0352294 A1 | 12/2016 | Nicollini |
| 2017/0180858 A1 | 6/2017 | Kidambi |
| 2017/0195788 A1 | 7/2017 | Nicollini |
| 2017/0223450 A1 | 8/2017 | Alvarez |
| 2018/0014123 A1 | 1/2018 | Shajaan |
| 2018/0027338 A1 | 1/2018 | Shajaan |

FOREIGN PATENT DOCUMENTS

| | | |
|---|---|---|
| EP | 2648333 A3 | 10/2013 |
| EP | 2978241 A1 | 1/2016 |
| JP | 2006-295357 A | 10/2006 |
| WO | WO 01/78446 A1 | 10/2001 |
| WO | WO 2012/148077 A3 | 11/2012 |
| WO | WO 2013167183 A1 * | 11/2013 ............... H04R 1/04 |

OTHER PUBLICATIONS

Extended European Search Report in European Patent Application No. EP 16199657, dated Apr. 11, 2017 (3 pages).

Extended European Search Report in European Patent Application No. EP 16199644, dated May 10, 2017 (3 pages).

Extended European Search Report in European Patent Application No. EP 16199653, dated May 17, 2017 (3 pages).

Pedersen M. et al., "High-Performance Condenser Microphone with Fully Integrated CMOS Amplifier and DC-DC Voltage Converter," Journal of Microelectromechanical Systems, vol. 7, No. 4, Dec. 1998, pp. 387-394 (8 pages).

Extended European Search Report in European Patent Application No. EP17202253, dated Mar. 15, 2018 (3 pages).

Extended European Search Report in European Patent Application No. EP 17202256, dated Mar. 21, 2018 (3 pages).

(56) References Cited

OTHER PUBLICATIONS

Extended European Search Report in European Patent Application No. EP 17202265, dated Apr. 10, 2018 (3 pages).
White P., "Are back-electret mics any good?," SOS-Sound on Sound, downloaded on Dec. 17, 2018 from https://web.archive/org/web/20160803061346/https://www.soundonsound.com/sound-advice/q-are-back-electret-mics-any-good (3 pages).
Communication pursuant to Article 94(3) EPC in European Patent Application No. 17202256.8, dated Jan. 3, 2019 (7 pages).

* cited by examiner

TRANSDUCER WITH A HIGH SENSITIVITY

CROSS-REFERENCE TO RELATED APPLICATIONS

This application claims the benefit of European Patent Application Serial No. 16199651.7, filed Nov. 18, 2016, which is incorporated herein by reference in its entirety.

FIELD OF THE INVENTION

The present invention relates to an assembly comprising a capacitive, biased transducer configured to receive or sense a movement of one element in relation to another element, such as the movement of a diaphragm in relation to a back plate, and output a corresponding signal. Usually, such transducers are supplied a relatively high voltage in order to obtain a sufficient sensitivity.

BACKGROUND OF THE INVENTION

In this context, a transducer may be a microphone, a vibration sensor or another type of sensor capable of sensing a change in a parameter of the surroundings or itself and output a signal varying at least substantially in the same way.

However, at large input signal, such transducers are able to have an output voltage swing which actually is higher than their biasing voltage, which is a higher voltage than what a following amplifier is able to handle. Different approaches to this problem have been taken, such as US2008205668, U.S. Pat. No. 8,223,981, WO0178446, U.S. Pat. No. 9,148,729, US2015/0137834, U.S. Pat. No. 8,170,237, US2012/269367, JP2006-295357, US2014/037121 and "High-Performance Condenser Microphone with Fully integrated CMOS Amplifier and DC-DC Voltage Converter", Michael Pedersen et al, Journal of Micromechanical systems, IEEE Service center, US. Vl. 7, No. 4, 1 Dec. 1998 and U.S. Pat. No. 8,625,809.

SUMMARY OF INVENTION

The present invention relates to another approach which enables the amplifier to handle the large voltage outputs of such transducers.

In a first aspect, the invention relates to an assembly comprising:
a transducer comprising:
  one or more stationary elements,
  a movable element movable in relation to the stationary element(s), an electrical field existing between two of the movable element and the stationary element(s), the electrical field corresponding to a first voltage, and
  a transducer output,
  a voltage supply configured to output a second voltage,
  an amplifier comprising an amplifier input and an amplifier output, the amplifier being connected to the voltage supply, and
  a transporting element configured to receive a signal from the transducer output and provide a corresponding signal to the amplifier input,
  wherein the second voltage is at least 60% of the first voltage.

In this respect, the elements of the assembly may be provided in a single housing or even in the same chip. Alternatively, different elements may be provided separately and interconnected, such as by electrical conductors.

A voltage supply may be an element configured to both generate and output the voltage, or simply receive and output the voltage, such as between two conductors. A voltage supply may simply be two conductors configured to receive the voltage there between and supply that voltage to other elements of the assembly. A voltage supply may alternatively be configured to receive one voltage, convert this voltage into another voltage and output the other voltage. A voltage supply may further comprise a voltage generator, such as a battery. A voltage supply may be e.g. two legs of a chip if desired.

In this respect, a transducer is an element configured to sense movement of the movable element in relation to the stationary element(s). Naturally, it is of no importance which element moves in relation to another element. The distance/position variation between the movable element and the stationary element(s) will cause an output signal on the transducer output.

Any number of stationary elements may be provided. Often one or two stationary elements are provided in situations where the movable element is a plane element, where the stationary element(s) is/are also plane element(s) provided parallel to the movable element in a desired distance so that the movable element may move while being in a vicinity of the stationary element(s). Transducers of this type may be microphones, where the movable element may then be a diaphragm.

The electrical field exists between two of the movable element and the stationary element(s). If a single stationary element is provided, the first field exists between the stationary element and the movable element. If two stationary elements are provided, the field may exist between the stationary elements or between one stationary element and the movable element.

As described below, the field may be created by a biasing voltage and/or a pre-charged layer.

The electrical field corresponds to a voltage. The corresponding voltage is a voltage which, when provided over the elements between which the field exists, provides the same electrical field or at least substantially the same electrical field, such as when the movable element is not moving (in a rest configuration). If the field is created by both a biasing voltage and a pre-charged layer, the corresponding voltage will be that corresponding to the field created by the pre-charging added that fed as a biasing voltage. Naturally, different voltages may be provided to all of the stationary elements and the movable element.

Multiple movable elements may also be provided if desired, where any additional movable element may also have a pre-charged layer and/or receive a voltage or output a signal.

An output of the transducer may be derived from any one or more of the stationary element(s) and the movable element. Usually, the output of the transceiver will depend on the movement or position of the movable element in relation to the stationary element(s).

An amplifier is an element which is configured to receive an input signal and output an output signal where the intensity (voltage/current or the like) of the output signal has been amplified. In this respect, an amplification may be higher than 1, so that the intensity output is higher than that received, or lower than 1, whereby the intensity output is lower than that received. An amplification of 1 outputs the same intensity. This may be desired for other purposes, such as for altering the apparent impedance of a circuit receiving the output of the amplifier compared to the component feeding the signal to the amplifier. The amplification may also be negative, whereby the polarization of the signal output of the amplifier is the opposite of that received.

Naturally, an amplifier may have multiple inputs. Often, when a single input is described, any additional inputs may be provided with predetermined signals or voltages, such as ground.

An amplifier is a power consuming element and is fed by the second voltage. Often the second voltage is fed over or between two terminals or conductors of the amplifier. Usually, the signal output of the amplifier is limited to within the voltage or voltage range supplied to the amplifier. Amplifiers usually do not comprise voltage converters outputting voltages exceeding the voltage supplied.

Naturally, the signal output of the transducer may be fed directly to the amplifier input. However, in some situations, a signal filtering/adaptation is desired and/or other signal handling, between these components. In some situations, components may be provided for generating a desired impedance of the signal output of the transducer or the amplifier input. In those or other situations, a galvanic separation of the two is desired.

Thus, between the transducer output and the amplifier input, a transporting element may be provided which may simply be a conductor or which may comprise components for altering the signal output of the transducer before inputting a signal to the amplifier. Preferably, any components of the transporting element are passive, i.e. require no separate power supply.

The second voltage is at least 60% of the first voltage. In this respect, the first and second voltages are the absolute values of the voltages.

This has the advantage that the amplifier is capable of handling all of or most of the signal output by the transducer.

Often, the first voltage, such as a voltage supplied to the transducer, is 4-20V, such as 5-20V, such as 10-20V whereas usual supply voltages for amplifiers is in the range of 0.8-3.6V.

The present assembly may be for use in hearing aids, hearables or vibration sensors and therefore usually act on rather low voltages.

Preferably, the second voltage is at least 70%, 80%, 90%, 100%, 110%, 120%, 130%, 140%, 150%, 160%, 170%, 180%, 190% or even 200% of the first voltage, as e.g. a capacitive dual back plate device may be capable of outputting a voltage within a range of almost twice the corresponding voltage, when the movable element moves from one back plate to the other.

In general, transducers may be capacitive transducers. In one embodiment, the transducer is a MEMS transducer.

In one embodiment, the transporting element is configured to feed to the amplifier input a signal with a voltage of 95% or more of a voltage of a signal received from the transducer output. It may not be desired to filter the signal at this point in the circuit. Thus, preferably, only a small effect is caused on the signal, such as providing anti-parallel diodes to a predetermined voltage to define the impedance of the amplifier input, while perhaps ensuring that the diodes keep operating (voltage across the diodes does not exceed the break-down voltage.

As mentioned above, in one embodiment, at least one of the two of the movable element and the stationary element(s), between which the electrical field exists, comprises a pre-charged layer. In this context, a pre-charged layer may be an element, usually extending in a direction or plane of the movable element, in which a charge is stored. This layer preferably is electrically isolated from other elements in order to prevent the charge from escaping.

In that or another embodiment, the assembly may further comprise a first voltage supply configured to output a predetermined voltage, the transducer comprising a voltage input configured to receive the predetermined voltage and provide the predetermined voltage between the two of the movable element and the stationary element(s). Thus, at least a part of the field is caused by the biasing voltage provided. Then, the predetermined voltage may be lower than or equal to the first voltage.

It is known that pre-charged layers tend to loose charge over time. The predetermined voltage may then be used for "topping up" the electrical field to arrive at a desired level. Also, the predetermined voltage may be used for actually varying the electrical field strength if desired.

It is noted that the first and second voltage supplies may share a conductor or may be formed of a single conductor, if a common conductor, such as a ground, is provided.

The first and second voltages may be positive or negative and may have any value, depending on the type of amplifier, signal, transducer and the like.

In a preferred embodiment, the predetermined voltage corresponds to the first voltage. Then, no or at least no substantial charge is permanently present in the transducer, so that the electrical field is generated only or at least mainly due t the biasing voltage.

In one situation, the transporting element comprises a capacitor. In this manner, the transducer element(s) (movable or stationary) to which the transducer output is connected may be biased to a predetermined voltage without having to feed that voltage to the amplifier input—or without the amplifier or other components removing that biasing. In this respect, the capacitance of that capacitor preferably is sufficiently high for it to not filter the signal transported to any significant degree. Preferably, this capacitance is at least 2, such as at least 4, such as at least 6, such as at least 8 times a capacitance of the transducer.

Naturally, the assembly may comprise two independent voltage supplies, such as separate conductors for receiving the second and predetermined/first voltages. Alternatively, the assembly may further comprise a second voltage input, the first voltage supply being configured to receive the predetermined/first voltage from the second voltage input, the second voltage supply comprising a voltage converter connected to the second voltage input and outputting the second voltage. Thus, the predetermined/first voltage is directly received from the second voltage input. The second voltage is derived from the second voltage input using a voltage converter. Naturally, a voltage converter may convert a received voltage into a higher or lower (or the same) voltage. Also, the predetermined/first and second voltages may be reversed so that the second voltage is derived directly from the second voltage input.

In another alternative, the assembly further comprises a second voltage input, the first voltage supply comprising a first voltage converter connected to the second voltage input and outputting the predetermined/first voltage, the second voltage supply comprising a second voltage converter connected to the second voltage input and outputting the second voltage. Thus, any voltage may be supplied to or by the second voltage input, where separate voltage converters are provided for each of the predetermined/first and second voltages.

Naturally, one voltage converter may be provided for converting the voltage from the second voltage input to one of the predetermined/first and second voltages, and another voltage converter from that predetermined/first/second voltage to the other of the predetermined/first/second voltage.

In one embodiment, the assembly further comprises a third voltage supply and a signal converter configured to receive a signal from the amplifier output and output a converted signal, the third voltage supply supplying a third voltage to the signal converter. A signal converter of this type may be e.g. a filter, an attenuator or an amplifier. Different types of filter may be inserted, e.g. a high-pass filter suppressing unwanted low frequency signals, a low-pass filter suppressing unwanted high frequency signals such as ultrasound, or a notch filter suppressing a resonance peak of the transducer. Preferably these filters are programmable, so that the frequency response of the filter can be adapted to the specific requirements of the application of the transducer. For example, the exact frequency of the notch can be programmed to match the resonance frequency of a microphone including the influence of the acoustical load of the application.

Filters or attenuators may be provided after the amplifier, as the noise created by the amplifier may be reduced by the filter/attenuator.

In fact, filters or attenuators may be provided as passive components, i.e. not requiring a power supply. Naturally, more complex filters/attenuators, such as if provided as a DSP, may be provided which actually do require a power supply.

The preferred type of signal converter is a second amplifier, which is then supplied by the third voltage. The second amplifier may be provided to adapt the signal output of the first amplifier (or any filter/attenuator provided between the amplifiers) to any type of circuit or component which is to receive the output of the present assembly.

One problem encountered by supplying the first amplifier with the, compared to usual situations, rather high supply voltage is that the output voltage thereof may be too high for any component which is to receive the output of the assembly. A second amplifier may be provided to receive the output of the first amplifier/filter or the like and output a signal having a voltage range (output voltage swing) adapted to such components.

Preferably, the third voltage is lower than the second voltage, such as 0.5 times, 0.3 times or even 0.2 times the second voltage.

In one embodiment, the movable element is a diaphragm and the one or more stationary elements comprise a back plate, where the electrical field exists between the diaphragm and the back plate. Naturally, multiple back plates may be provided, where no field needs to exist between the other(s), so that, for example, no voltage need be supplied to the other(s).

In this respect, the diaphragm usually is much more resilient or flexible than the back plate, so that when a relative movement is provided, it will be the diaphragm moving in relation to the back plate and the remainder of the transducer.

A transducer of this type may be a biased microphone. In transducers of this type, a first voltage of 4-20V is often provided for biasing the diaphragm in relation to the back plate. The transducer output may be derived from or connected to any of the back plate and the diaphragm.

Often, microphones are used in battery-operated situations, so that the above voltage converter(s) may be provided, as well as the above second amplifier to have the assembly output a signal with a voltage within a rather limited voltage range, such as between 0 and a battery voltage as low as 0.8V, 1.3V, 1.8V or 3.3V, for example.

Microphones often have two or more chambers. Two chambers are often provided on opposite sides of the diaphragm and are delimited by the diaphragm and other surfaces of the transducer. One or more chambers has/have a sound input for sound to enter a chamber and thereby interact with the diaphragm.

In another embodiment:
the first voltage supply is configured to output a third and a fourth voltage, an absolute value of the difference between the third and fourth voltages being the predetermined/first voltage,
the movable element is a diaphragm, the transducer output being connected to the diaphragm,
one stationary element is a first back plate,
the third voltage being supplied to the first back plate, and
another stationary element is a second back plate, the fourth voltage being applied to the second back plate.

In this transducer, which may again be a microphone, two back plates may be provided. Usually, the back plates are provided on opposite sides of the diaphragm and are parallel with the diaphragm.

Now, voltages are provided to the back plates. The difference in voltage between the third and fourth voltages is the actual biasing voltage applied to the transducer. Naturally, one of these voltages may be ground, but any voltages may be used.

As mentioned, the transducer output may be connected to any of the diaphragm and back plate(s).

In one embodiment, however:
the movable element is a diaphragm, the voltage input being configured to provide the predetermined/first voltage to the diaphragm,
a second transducer output,
one stationary element is a first back plate connected to the transducer output, and
another stationary element is a second back plate connected to the second transducer output,
where the amplifier has a second amplifier input and the assembly further comprises a second transporting element configured to receive a signal from the second transducer output and provide a corresponding signal to the second amplifier input. This second transporting element may be of the type described above.

In this situation, the amplifier may be a differential amplifier receiving the outputs from the two back plates.

A second aspect of the invention relates to an amplification unit for use in the above assembly where the transducer receives the first voltage and thus has no or at least no substantial pre-charging, the unit comprising:
a first voltage supply configured to output a first voltage,
a second voltage supply configured to output a second voltage,
an amplifier comprising an amplifier input and an amplifier output, the amplifier being connected to the second voltage supply, and
two input/output terminals, the first voltage being provided between the two input/output terminals,
a transporting element configured to receive a signal from one of the input/output terminals and provide a corresponding signal to the amplifier input,
wherein the second voltage is at least 60% of the first voltage.

Naturally, all the considerations, embodiments and situations of the first aspect relate also to this aspect of the invention.

This unit is well suited for providing as a single chip/ASIC, FPGA, component, circuit. Further, when the amplification of the amplifier, the first/second voltages, and properties of e.g. any components of the transporting element may be adaptable or programmable, the unit may be suited for many different types of transducers.

Clearly, this amplification unit is configured to be connected to a transducer. Usually, transducers have terminals for receiving the biasing voltage and for outputting a transducer signal. Two terminals are required (one may be a common ground), the input/output terminals, for supplying the voltage to the transducer. One of these terminals may additionally be used for feeding the transducer output to the amplifier. Alternatively, a third terminal may be used for that purpose, where this terminal is then connected to the transporting element.

Preferably, the transducer has only two terminals which may be connected, such as directly connected, to the two input/output terminals in order to arrive at the assembly according to the first aspect of the invention.

As described above, a voltage input may be provided, the first voltage supply comprising a first voltage converter connected to the second voltage input and outputting the first voltage, the second voltage supply comprising a second voltage converter connected to the voltage input and outputting the second voltage.

Alternatively, the unit may comprise a third voltage supply and a signal converter configured to receive a signal from the amplifier output and output a converted signal, the third voltage supply supplying a third voltage to the signal converter. Naturally, this unit may also comprise the above second amplifier and/or any filters/attenuators provided after the first amplifier.

The present embodiments may be combined with a number of other advantageous improvements of systems, such as the Applicants co-pending applications filed on even date and with the titles: "A CIRCUIT FOR PROVIDING A HIGH AND A LOW IMPEDANCE AND A SYSTEM COMPRISING THE CIRCUIT", claiming priority from EP16199644.2, "A SENSING CIRCUIT COMPRISING AN AMPLIFYING CIRCUIT AND THE AMPLIFYING CIRCUIT", claiming priority from EP16199653.3, "AN ASSEMBLY AND AN AMPLIFIER FOR USE IN THE ASSEMBLY", claiming priority from EP16199655.8 and "A PHASE CORRECTING SYSTEM AND A PHASE CORRECTABLE TRANSDUCER SYSTEM", claiming priority from EP16199657.4. These references are hereby incorporated herein by reference in their entireties.

BRIEF DESCRIPTION OF THE DRAWINGS

In the following, preferred embodiments are described with reference to the drawing, wherein.

DETAILED DESCRIPTION OF THE INVENTION

Figure 1:
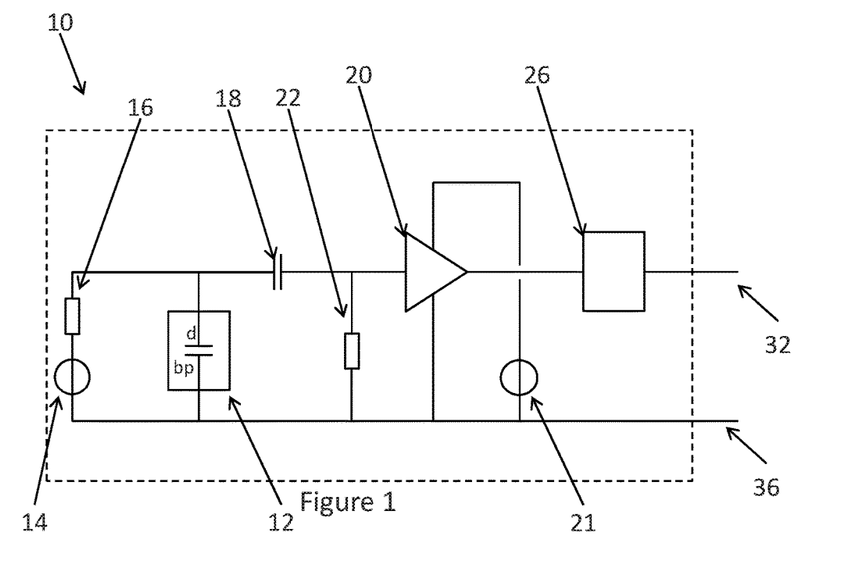
FIG. 1 illustrates an embodiment of an assembly according to the invention.

In FIG. 1, an assembly 10 is illustrated having a transducer 12, preferably a biased MEMS transducer, having a diaphragm, d, and a back plate, bp, between which a biasing voltage is provided. An output of the transducer 12 is correlated with a deflection of the diaphragm relative to the back plate so that when the diaphragm is vibrated, such as when exposed to sound, a correspondingly varied output is seen.

The transducer may e.g. be a microphone or a vibration sensor.

The diaphragm d is flexible and able to deform in response to the variation, such as a sound, where the back plate is at least substantially rigid, so that the only moving element is the diaphragm.

The biasing voltage is provided from a charge pump or voltage supply 14 supplying the voltage to the diaphragm via a high impedance element 16, which may be a pair of anti-parallel diodes. The biasing voltage creates a corresponding electrical field in the transducer.

The output of the transducer 12 is fed through a capacitor 18 to an amplifier 20. The desired operation of the capacitor 18 is to transfer the varying signal from the transducer without creating a DC connection between the transducer and the remainder of the circuit, as this could destroy the biasing of the transducer. Thus, the capacitor preferably has a value being sufficiently high. At present, the capacitor 18 is at least 2, such as at least 4, such as at least 6, such as at least 8 times the capacitance of the transducer.

The amplifier 20 is provided to amplify or buffer the signal from the transducer 12/capacitor 18. This amplification may be 1, above 1 (the output voltage is higher than the input voltage) or below 1, the output voltage is lower than the input voltage). Naturally, if the gain is negative, its absolute value could be, again, equal to, below or above 1. For example, the amplifier 20 may be a source follower, e.g. a MOSFET source follower. A desired characteristic of the amplifier often is that the output impedance of the amplifier is capable of driving the subsequent circuitry.

In order to obtain a sufficient sensitivity of the transducer, the biasing voltage of the transducer 12 is desired rather high. A biasing voltage of 12V is often used in hearing aid or hearable applications, where the receiving electronics, such as an amplifier, usually is supplied only 0.9V or 1.8V, for example, in hearing aids and hearables.

However, the output voltage swing of the transducer is, in fact, even higher than its biasing voltage, as the diaphragm may move from a position far from its rest position and far away from the back plate to an opposite position very near to the back plate. Thus, in theory, the output of the transducer may be up to twice the biasing voltage. Often, however, the movement of the diaphragm is physically limited in the direction toward and close to the back plate in order to ensure that the diaphragm does not touch the back plate.

In addition to this, transducers often have resonance peaks where the output voltage is higher than at other frequencies. Such resonance peaks are also desirably handled by the amplifier.

Naturally, the amplifier may be provided with a dip filter or another filter targeting frequencies at a resonance frequency and reducing the signal or output voltage at such frequencies compared to other frequencies.

Consequently, in order for the amplifier to be able to handle such an output voltage swing, the amplifier is supplied a comparable supply voltage being at least 60% but preferably at least 65%, 70%, 80%, 90%, 100%, 120%, 125%, 130%, 140% or more times the biasing voltage to the transducer (e.g. the transducer biasing voltage multiplied by 0.65, 0.7, 0.8 etc.).

In this manner, the input swing of the amplifier, which would normally be the voltage supplied to the amplifier, is sufficiently large for it to handle the output of the transducer without distorting or removing part of the received signal.

In usual set-ups of this type, a high impedance circuit 22, such as a pair of anti-parallel diodes, is preferably provided between ground and the connector between the capacitor 18 and the input of amplifier 20 to provide a defined quiescent voltage to the amplifier at a high impedance level.

As the amplifier 20 receives a rather large input signal and supply voltage, this could cause problems for subsequent components, such as component 26, receiving the signal output of the amplifier 20. Such components could be filters/limiters/attenuators or a further amplifier. Naturally, filters/limiters/attenuators may be passive and thus not requiring any supply voltage, but if such components, as an amplifier would, require a supply voltage, the input voltage swing of this component should be adapted to the output voltage swing of the amplifier 20 or any components provided between these and the input in question.

Preferably, in this situation, an attenuator or a filter may be provided after the amplifier 20 to reduce the signal intensity output of the amplifier and thereby adapt the signal for the subsequent circuit. An attenuator may be frequency-independent and may be a capacitive attenuator. Filters may be used for attenuating e.g. at resonance frequencies of the transducer.

Preferably, the gain of the amplifier 20 is close to 1, such as between 0.1 and 10, preferably between 0.5 and 2, so that the main result of the amplifier 20 is to adapt the impedance experienced by the subsequent amplifier or circuit. The output impedance of the transducer 12 and the amplifier 20 usually are very different. Often, the transducer is capacitive and has a capacitance between 0.5 pF and 10 pF, where the amplifier may be resistive and have an impedance between 100 Ohm and 20 kOhm.

In another example, the voltage supply 14 may supply 12V to the transducer, where the amplifier 20 is supplied 10V, but a subsequent amplifier 26 is supplied only 1V, whereby the amplifier 20 is provided with a<1 gain converting a maximum input signal (10V) to a maximum output signal of 1V. Alternatively, the gain of amplifier 20 may be close to 1, and an attenuator may be provided in order to reduce the signal fed to subsequent component 26, where the attenuation is defined by the ratio of the supply voltages of amplifier 20 and component 26. Is the situation that component 26 is directly received from an input, the voltage on that input can be used to select a suitable attenuation.

In FIG. 1, the amplifier is supplied via a power supply 21.

Figure 3:
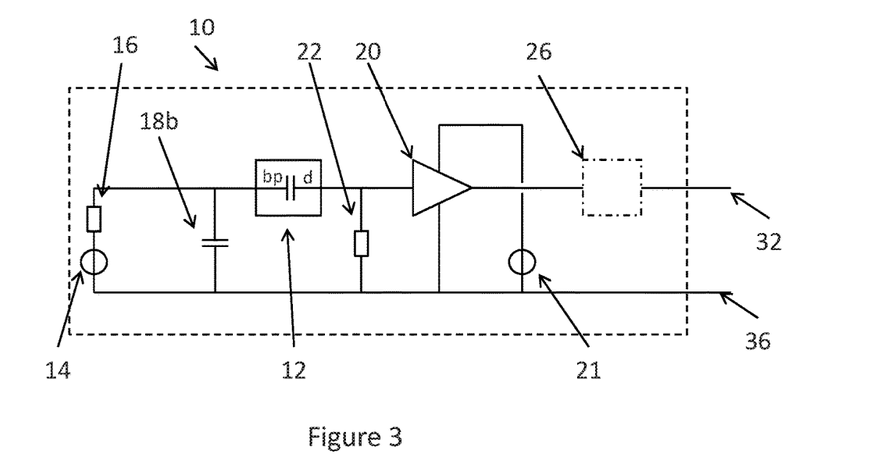
FIG. 3 illustrates another embodiment of the invention.

Another set-up is seen in FIG. 3, wherein the positions of the transducer 12 and the capacitor 18 have been interchanged with each other.

In this embodiment, the transducer has its output (the diaphragm in this embodiment) directly connected to the amplifier input, where a capacitor 18b is provided to generate a DC decoupling from the biased back plate and ground. As for the capacitor 18, the capacitor 18b preferably has a capacity large enough for it to not affect the AC behaviour (in the frequency range of interest) of the transducer and the system.

In general, transducers having a single back plate may be operated where:

The diaphragm is biased and outputs the transducer signal, while the back plate is connected to ground (FIG. 1), The back plate is biased while the diaphragm outputs the transducer signal (FIG. 3), The back plate is biased and outputs the transducer signal, while the diaphragm is connected to ground, and The diaphragm is biased while the back plate outputs the transducer signal.

Naturally, the transducer may be provided with more elements, typically two back plates—one positioned on either side of the diaphragm. The back plates are parallel to the diaphragm when in its rest position. In that situation, a number of different set-ups may be chosen from.

Figure 4:
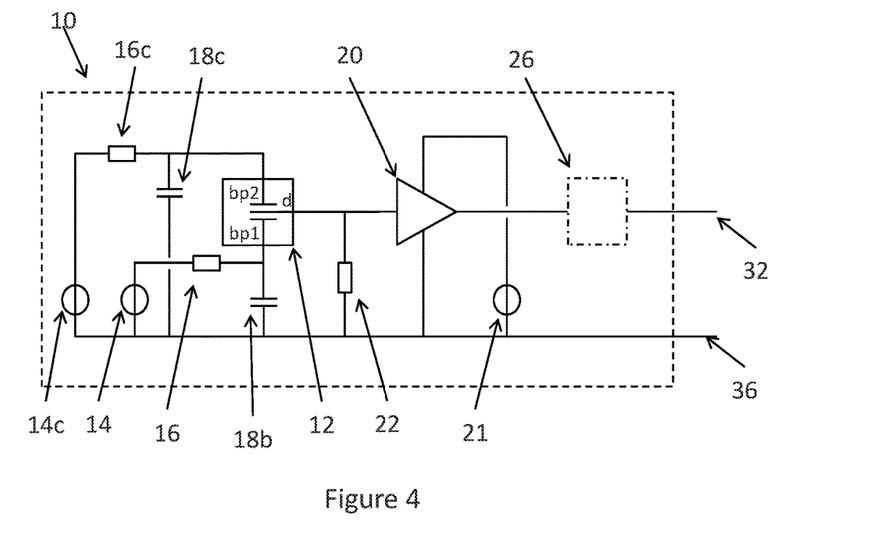
FIGS. 4 and 4b illustrate a third embodiment of the invention.

One dual back plate embodiment, is seen in FIG. 4, wherein the two back plates, bp1 and bp2, are individually biased by two voltage sources 14 and 14c, respectively, through high impedance elements 16 and 16c, respectively.

As in the embodiment of FIG. 3, capacitors 18b and 18c are provided—one for each biased back plate.

The diaphragm is connected to the amplifier as seen in FIG. 3.

To obtain the largest possible biasing, one of the supplies 14 and 14c would often provide a negative voltage and the other a positive voltage (often with the same absolute value).

In this embodiment, the voltage supply from the supply 21 is selected in response to a difference in the two voltage supplies 14 and 14c. In this respect, the difference is the absolute value of one voltage subtracted from the other.

In an alternative embodiment, a single biasing voltage is supplied to the diaphragm (as in FIG. 2) where an output is provided from both back plates, which outputs are fed to two inputs of an amplifier. Naturally, between each back plate to the corresponding amplifier input, different circuits or transport elements may be provided.

Figure 5:
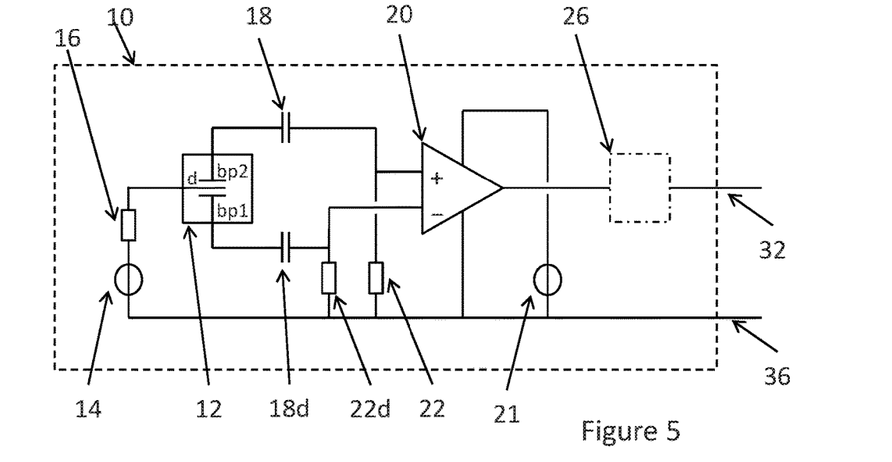
FIG. 5 illustrates a fourth embodiment of the invention.

In FIG. 5, another embodiment is seen where the diaphragm is biased in the same manner as in FIG. 1. However, the output of the transducer is derived from the two back plates bp1 and bp2, the output of which are fed, again through capacitors 18 and 18d, respectively, and still using high impedance elements 22 and 22d, respectively, to the two inputs of a differential amplifier 20

In this situation, the output voltage swing of the transducer may be higher, such as twice as high, than in the situation in FIG. 1, whereby the amplifier supply 21 may be at least 60%, such as at least 80%, such as at least 100%, 120%, 140%, 160%, 180%, or up to e.g. 200% of the biasing voltage of the transducer.

Figure 2:
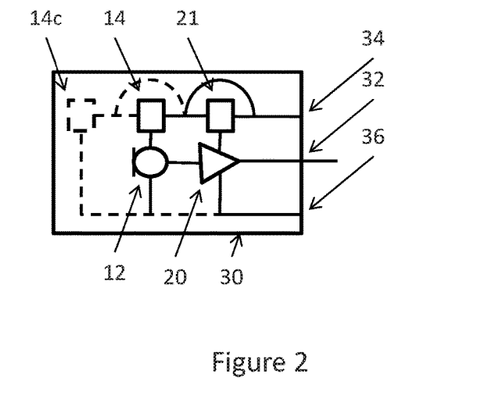
FIG. 2 illustrates providing an assembly according to the invention in a housing.

When the set-up of any of the embodiments described is packaged in e.g. a housing 30 (or it for another reason is desired to receive a single voltage to feed the two devices; see FIG. 2), it may be desired to have only a single supply voltage supplied to the housing. In the present housing, the output of the amplifier 20 is output on connector 32 and the supply voltage is provided on connector 34 and ground on connector 36.

The voltage supply 21 for the amplifier may then either derive the voltage directly (if having the correct value) from the input 34, or a voltage converter 38 may be provided for increasing (e.g. a DC/DC converter) or decreasing (DC/DC converter or voltage divider) the voltage received on input 34 and for supplying to the amplifier 20.

The voltage from the input 34 or the voltage from the voltage converter 21 may be supplied to the transducer 12 if desired. If not, another voltage converter 40 may be provided for converting the voltage received on input 34 or from the converter 21 into a voltage to be supplied to the transducer 12.

In the situation of FIG. 4, two supplies 14/14c are required for the transducer. Otherwise, the transducer may be connected to ground and the DC biasing of the diaphragm adapted accordingly.

In this embodiment, the supplies 14/14c each supplies a back plate, and the output of the transducer is derived from the diaphragm. The individual biasing supply to the transducer is as seen in FIG. 3—now just provided twice.

A number of components have been left out in order to simplify the drawing.

Figure 4B:
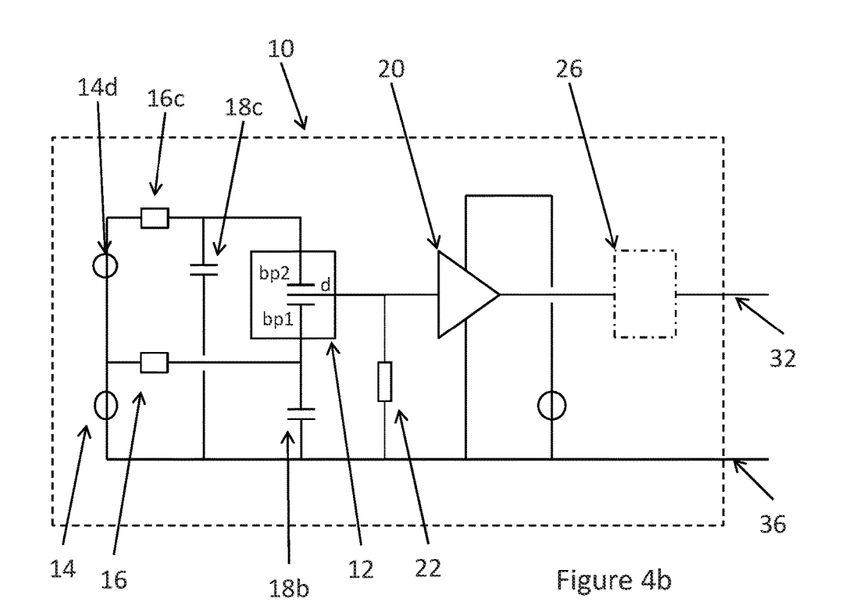

An alternative embodiment is seen in FIG. 4b, where the supply 14d generates or defines the voltage difference between the back plates and the supply 14 an offset thereof.

In FIG. 5, a set-up is seen where the diaphragm is biased with the supply 14, where an output is derived from both back plates which, as seen in FIG. 3, are fed to the amplifier. Now, the amplifier is a differential amplifier having two inputs each receiving the signal from a back plate.

Naturally, additional components may be provided for receiving the output of the amplifier 20 and which are provided in the housing, such as a filter/attenuator or another amplifier. Then, the additional components may, if requiring a voltage supply, be supplied by another voltage converter or directly by the voltage received on input 34.

The present embodiments have been described using transducers with biased elements. Such transducers may be formed by MEMS elements or capacitive sensors, such as microphones, acceleration sensors, vibration sensors, displacement sensors, rotational sensors, pressure sensors, tactile sensors or the like.

Figure 6:
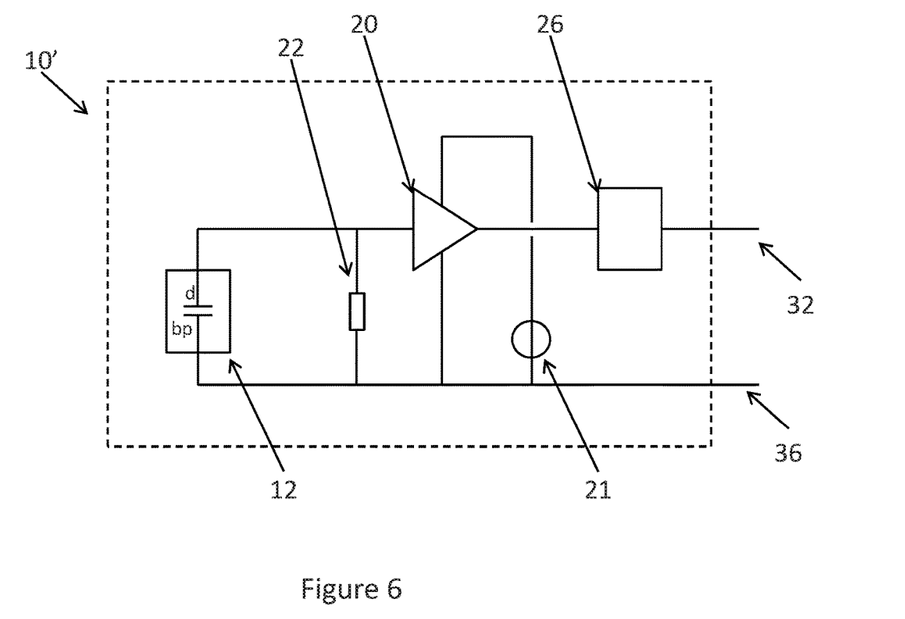
FIG. 6 illustrates a fifth embodiment of the invention with a pre-charged transducer.

In FIG. 6, a transducer is illustrated which does not receive a biasing voltage. This transducer has a pre-charged layer in the membrane and/or back plate and thus has a "built-in" electrical field. The operation of this transducer is the same as that described above: when the diaphragm moves, a signal is output which depends on the movement and the size of the electrical field. When there is no biasing voltage supplied, the capacitor 18 may also be left out.

In this situation, the voltage supply to the amplifier is determined based on a voltage corresponding to the electrical field in the transducer. The electrical field caused by the pre-charged layer may be equated or corresponding to a voltage creating the same size of the electrical field.

Naturally, a further alternative would be a transducer having both a pre-charged layer and being supplied with a biasing voltage. In this situation, the electrical field in the transducer will have components both from the pre-charging and the biasing voltage. Again, an overall voltage may be corresponding to the resulting electrical field in the transducer. In this situation, set-ups as those of FIGS. 1-5 may be used, where account is taken in the supply voltage from the fact that a portion of the electrical field is caused by the pre-charging.

The invention claimed is:

1. An assembly comprising:
   a transducer comprising:
     a one or more stationary elements,
     a movable element movable in relation to the stationary element(s), an electrical field existing between two of the movable element and the stationary element(s), the electrical field corresponding to a first voltage, and
     a transducer output,
   a voltage supply configured to output a second voltage,
   an amplifier comprising an amplifier input and an amplifier output, the amplifier being connected to the voltage supply,
   a transporting element configured to receive a signal from the transducer output and provide a corresponding signal to the amplifier input, and
   a first voltage supply configured to output the first voltage, the transducer further comprising a voltage input configured to receive the first voltage and provide the first voltage between the two of the movable element and the stationary element(s),
   wherein the second voltage is at least 60% of the first voltage.

2. An assembly according to claim 1, wherein the transducer is a MEMS transducer.

3. An assembly according to claim 1, wherein the transducer is a capacitive transducer.

4. An assembly according to claim 1, wherein the transporting element is configured to feed to the amplifier input a signal with a voltage of 95% or more of a voltage of a signal received from the transducer output.

5. An assembly according to claim 1, wherein the transporting element comprises a capacitor.

6. An assembly according to claim 1, wherein at least one of the two of the movable element or the stationary element(s) comprises a pre-charged layer.

7. An assembly according to claim 1, further comprising a second voltage input, the first voltage supply comprising a first voltage converter connected to the second voltage input and outputting the first voltage, the voltage supply comprising a second voltage converter connected to the second voltage input and outputting the second voltage.

8. An assembly according to claim 1, wherein the amplifier has a gain not exceeding 1.

9. An assembly according to claim 1, wherein the movable element is a diaphragm and the one or more stationary elements comprise a back plate, where the electrical field exists between the diaphragm and the back plate.

10. A unit according to claim 1, further comprising a second voltage input, the first voltage supply comprising a first voltage converter connected to the second voltage input and outputting the first voltage, a second voltage supply comprising a second voltage converter connected to the voltage input and outputting the second voltage.

11. A unit according to claim 1, further comprising a third voltage supply and a signal converter configured to receive a signal from the amplifier output and output a converted signal, the third voltage supply supplying a third voltage to the signal converter.

12. An assembly according to claim 1, further comprising a second voltage input, the first voltage supply comprising a first voltage converter connected to the second voltage input and outputting the first voltage, the voltage supply comprising a second voltage converter connected to the second voltage input and outputting the second voltage.

13. An assembly according to claim 1, further comprising a second voltage input, the first voltage supply being configured to receive the first voltage from the second voltage input, the voltage supply comprising a voltage converter connected to the second voltage input and outputting the second voltage.

14. An assembly according to claim 1 for use in a hearing aid, a hearable, or a vibration sensor, wherein the voltage supply is connected to a battery.

15. An assembly comprising:
   a transducer comprising:
     one or more stationary elements,
     a movable element movable in relation to the stationary element(s), an electrical field existing between two of the movable element and the stationary element(s), the electrical field corresponding to a first voltage, and
     a transducer output, a voltage supply configured to output a second voltage, an amplifier comprising an amplifier input and an amplifier output, the amplifier being connected to the voltage supply, a transporting element configured to receive a signal from the transducer output and provide a corresponding signal to the amplifier input, a second voltage input, a first voltage supply being configured to receive the first voltage from the second voltage input, the voltage supply comprising a voltage converter connected to the second voltage input and outputting the second voltage, wherein the second voltage is at least 60% of the first voltage.

16. An assembly according to claim 15, wherein the transducer is a MEMS transducer or a capacitive transducer.

17. An assembly according to claim 15, wherein the transporting element is configured to feed to the amplifier input a signal with a voltage of 95% or more of a voltage of a signal received from the transducer output.

\* \* \* \* \*